(12) United States Patent
Defour et al.

(10) Patent No.: US 8,112,743 B2
(45) Date of Patent: Feb. 7, 2012

(54) METHOD OF DESIGNING A SYSTEM COMPRISING HARDWARE AND SOFTWARE COMPONENTS

(75) Inventors: Martin Defour, Croissy/sur/Seine (FR); Jean Jourdan, Saint Jean d'Illac (FR); Franck Tailliez, Leognan (FR); Jean-Luc Voirin, Brest (FR)

(73) Assignee: Thales (FR)

( * ) Notice: Subject to any disclaimer, the term of this patent is extended or adjusted under 35 U.S.C. 154(b) by 1014 days.

(21) Appl. No.: 12/022,069

(22) Filed: Jan. 29, 2008

(65) Prior Publication Data

US 2008/0235655 A1   Sep. 25, 2008

(30) Foreign Application Priority Data

Jan. 30, 2007   (FR) ..................................... 07 00626

(51) Int. Cl.
    *G06F 9/44* (2006.01)
    *G06F 9/45* (2006.01)
    *G06F 11/00* (2006.01)
(52) U.S. Cl. ........................... 717/135; 703/22; 714/799
(58) Field of Classification Search ................. 717/135; 714/799; 703/22
    See application file for complete search history.

(56) References Cited

U.S. PATENT DOCUMENTS

| | | | | |
|---|---|---|---|---|
| 5,404,496 A | * | 4/1995 | Burroughs et al. | 714/28 |
| 7,076,417 B2 | * | 7/2006 | Jain et al. | 703/20 |
| 7,366,647 B2 | * | 4/2008 | Araya et al. | 703/14 |
| 7,430,498 B2 | * | 9/2008 | Butterfield et al. | 703/2 |
| 2006/0095247 A1 | | 5/2006 | O'Connell et al. | |
| 2008/0178154 A1 | * | 7/2008 | Basler et al. | 717/124 |

FOREIGN PATENT DOCUMENTS

| | | |
|---|---|---|
| EP | 1229446 A1 | 8/2002 |
| WO | 0227565 A1 | 4/2002 |

OTHER PUBLICATIONS

Franch et al., "Putting Non-Functional Requirements into Software Architecture," ACM, 1998, 8pg.*
Letier et al., "Deriving Operational Software Specifications from System Goals," ACM, 2002, 10pg.*
Paetsch et al., "Requirements Engineering and Agile Software Development," IEEE, 2003, 6pg.*

* cited by examiner

*Primary Examiner* — Li Zhen
*Assistant Examiner* — Ryan Coyer
(74) *Attorney, Agent, or Firm* — Lowe Hauptman Ham & Berner, LLP

(57) ABSTRACT

The invention relates to a method of designing a system. The system includes an application having software components and an architecture having hardware components on which the application is run. The system has to satisfy at least one functional and one non-functional requirement. The functional analysis step (11) obtains a breakdown of the functional need relating to the application. A step defines the architecture (12). A step for designs hardware components (13) according to the architecture. A step design software components (14) based on the breakdown of the functional need. A step for integrates the software components in the hardware components (15). A step validates the functional requirements of the system (16). A step validates the non-functional requirement of the system (17). An upstream step (21) validates the non-functional requirement of the system, preceding the steps for designing hardware components (13) and software components (14).

6 Claims, 5 Drawing Sheets

METHOD OF DESIGNING A SYSTEM COMPRISING HARDWARE AND SOFTWARE COMPONENTS

RELATED APPLICATIONS

The present application is based on, and claims priority from, French Application Number 07 00626, filed Jan. 30, 2007, the disclosure of which is hereby incorporated by reference herein in its entirety.

FIELD OF THE INVENTION

The present invention relates to system and software engineering, and more particularly to the upstream validation of the non-functional requirements of a system.

BACKGROUND OF THE INVENTION

Developing complex systems involves various problem-solving and incremental design steps. The aim is to construct a solution that satisfies the customer's requirements. Two types of requirements are generally differentiated: functional and non-functional requirements. The functional requirements relate to the functionalities that the system must provide. The non-functional requirements relate to the parameters of the system, such as performance, safety, integrity and availability.

The V cycle is a conventional system development method defining a succession of steps ranging from the definition of the system to its validation. A V cycle, as illustrated in FIG. 1, applied to the design of a system comprising an application comprising software components and an architecture comprising hardware components on which said application is run comprises the following steps.

The functional analysis step 11 is used to obtain a breakdown of the functional need relating to said application. The definition of the architecture 12 defines the basic building blocks of the system, their arrangement and how they are coordinated. The next two steps consist in designing the hardware components 13 defined by said architecture and the software components 14 based on the breakdown of the functional need. Integrating the software components in the hardware components 15 consists in assembling all the individual components developed in the preceding steps to form the system. The next step is to validate the functional requirements 16. The step for validating the non-functional requirements 17 occurs at the end of the development cycle.

This type of development method does not give total satisfaction because there is no way of guaranteeing from the system analysis and design phases that the system will predictably meet the non-functional requirements. Observations concerning this type of requirement are made in the system validation phase with risks, and very often modification costs, having a greater or lesser impact on the product.

One solution is to use functional simulation. Then, as early as the system design phase, an assessment is made of the non-functional characteristics of the system based on the creation of a model simultaneously describing the application and its implementation on a runtime platform. However, the necessary simulation model may prove very narrow and very costly to develop. Such a solution is not economically viable when it is applied to a complex system.

The invention seeks to overcome the abovementioned problems by modifying the system analysis and design method and by introducing an additional upstream step for validating the non-functional requirements making it possible to pre-validate the correct design of the system by exploiting architectural rules. By using the invention, it is possible to prove from the first phases of the development cycle that the design of the system is correct in light of the non-functional requirements. The invention therefore makes it possible to optimize the system design costs by detecting at the earliest possible stage any errors concerning the non-functional requirements and by exploiting architectural rules.

SUMMARY OF THE INVENTION

To this end, the subject of the invention is a method of designing a system, said system comprising an application comprising software components and an architecture comprising hardware components on which said application is run, said system having to satisfy at least one functional requirement and one non-functional requirement, comprising the following steps:
  a functional analysis step, for obtaining a breakdown of the functional need relating to said application,
  a step for defining the architecture,
  a step for designing hardware components according to said architecture,
  a step for designing software components based on the functional analysis,
  a step for integrating the software components in the hardware components,
  a step for validating the functional requirement of said system,
  a step for validating the non-functional requirement of said system,
wherein it also comprises an upstream step for validating the non-functional requirement of said system, preceding the steps for designing the hardware and software components.

Advantageously, the upstream step for validating the non-functional requirement comprises the following steps:
  modelling of the functional need based on said hierarchical breakdown,
  modelling of the architecture according to predefined architecture rules,
  allocation of the model of the functional need to the model of the architecture, making it possible to obtain a functional model allocated to the architecture model,
  computation of at least one non-functional parameter from the functional model allocated to the architecture model,
  comparison of the computed non-functional parameter with the non-functional requirement,
  if the non-functional requirement is met, design of the hardware components and software components,
  if the non-functional requirement is not met, definition of a new architecture or search for a new allocation of the model of the functional need to the model of the architecture.

Advantageously, the computed non-functional parameter relates to the performance of the system and comprises at least one of the following elements: the computation load of a processor, the bandwidth consumption of a network, the memory volume consumed by a processor, the system transit time.

Advantageously, the computed non-functional parameter relates to the safety of the system and comprises in particular the application of sets of inputs provoking particular events.

Advantageously, the computed non-functional parameter relates to the integrity of the system.

Advantageously, the computed non-functional parameter relates to the availability of the system and comprises in particular the availability rate of the architecture.

Advantageously, said system is a runtime platform and said upstream step for validating the non-functional requirements comprises the following steps:

- modelling of the functional need with functional subsystems, said functional subsystems alternately comprising processing operations and interchanges,
- modelling of the architecture with a group of computation nodes linked by buses, each of said computation nodes comprising partitions, said partitions being subdivided into tasks,
- allocation of said processing operations to said tasks, making it possible to obtain a functional model allocated to the architecture model,
- computation of at least one non-functional parameter from the functional model allocated to the architecture model,
- comparison of the computed non-functional parameter with the non-functional requirement,
- if the non-functional requirement is met, design of the hardware and software components,
- if the non-functional requirement is not met, definition of a new architecture or search for a new allocation of the processing operations to the tasks.

Still other objects and advantages of the present invention will become readily apparent to those skilled in the art from the following detailed description, wherein the preferred embodiments of the invention are shown and described, simply by way of illustration of the best mode contemplated of carrying out the invention. As will be realized, the invention is capable of other and different embodiments, and its several details are capable of modifications in various obvious aspects, all without departing from the invention. Accordingly, the drawings and description thereof are to be regarded as illustrative in nature, and not as restrictive.

BRIEF DESCRIPTION OF THE DRAWINGS

The present invention is illustrated by way of example, and not by limitation, in the figures of the accompanying drawings, wherein elements having the same reference numeral designations represent like elements throughout and wherein.

DETAILED DESCRIPTION OF THE INVENTION

Figure 1:
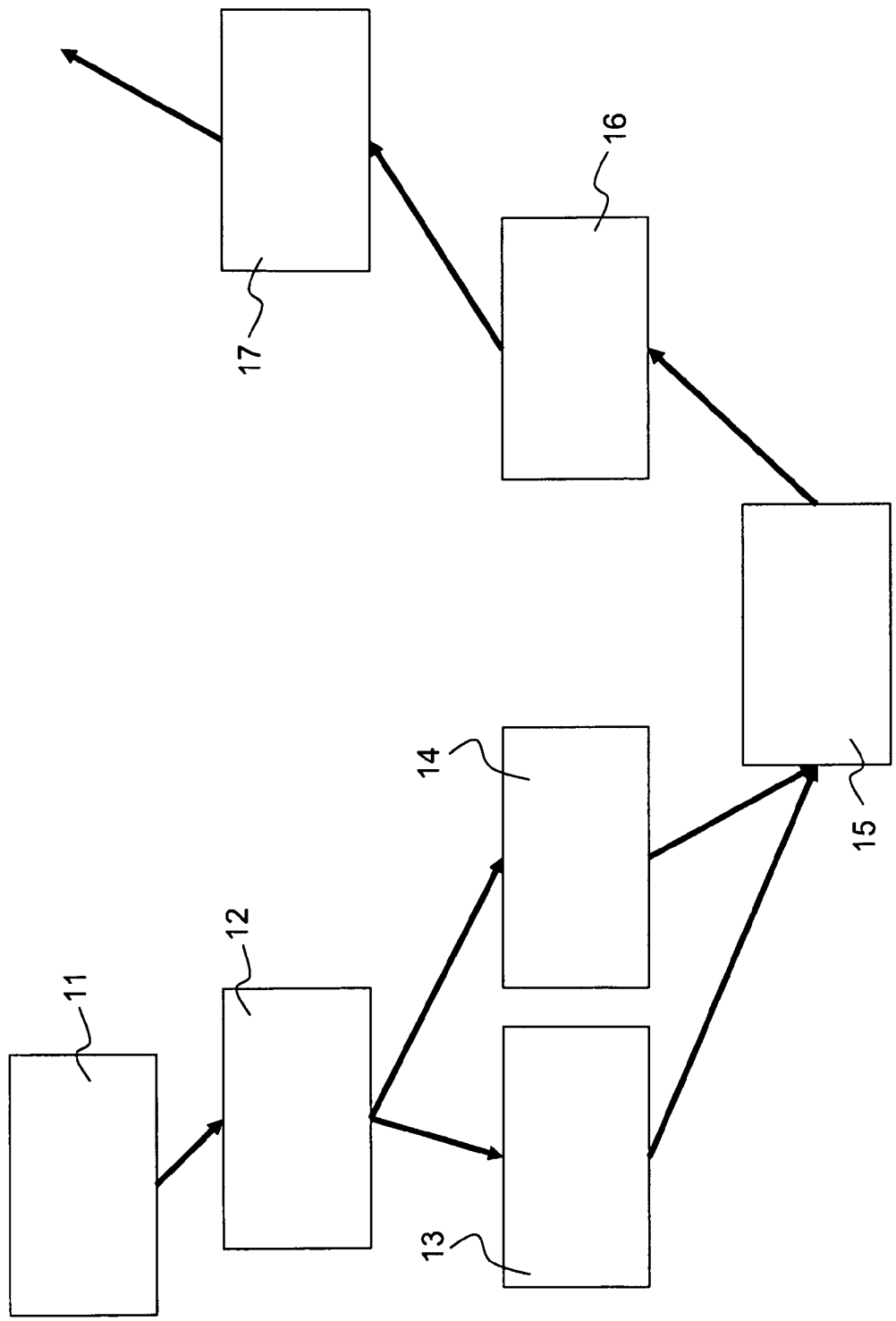
FIG. 1 represents a method of designing a system according to the prior art.
Figure 2:
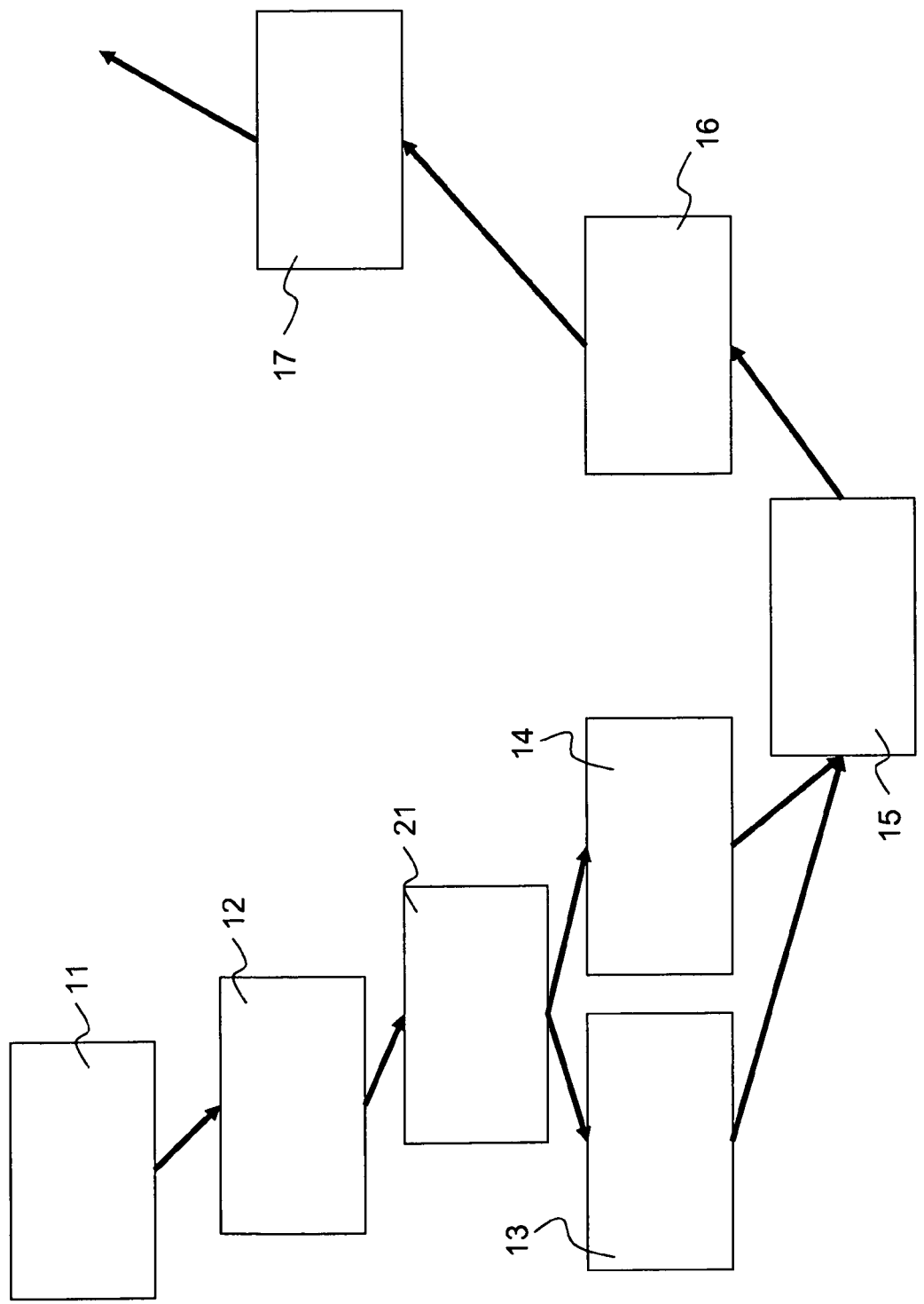
FIG. 2 represents a method of designing a system according to the invention.

The inventive method, illustrated in FIG. 2, involves modifying the system analysis and design method and introducing an additional upstream step 21 for validating the non-functional requirements making it possible to pre-validate the correct design of the system by exploiting architectural rules.

Figure 3:
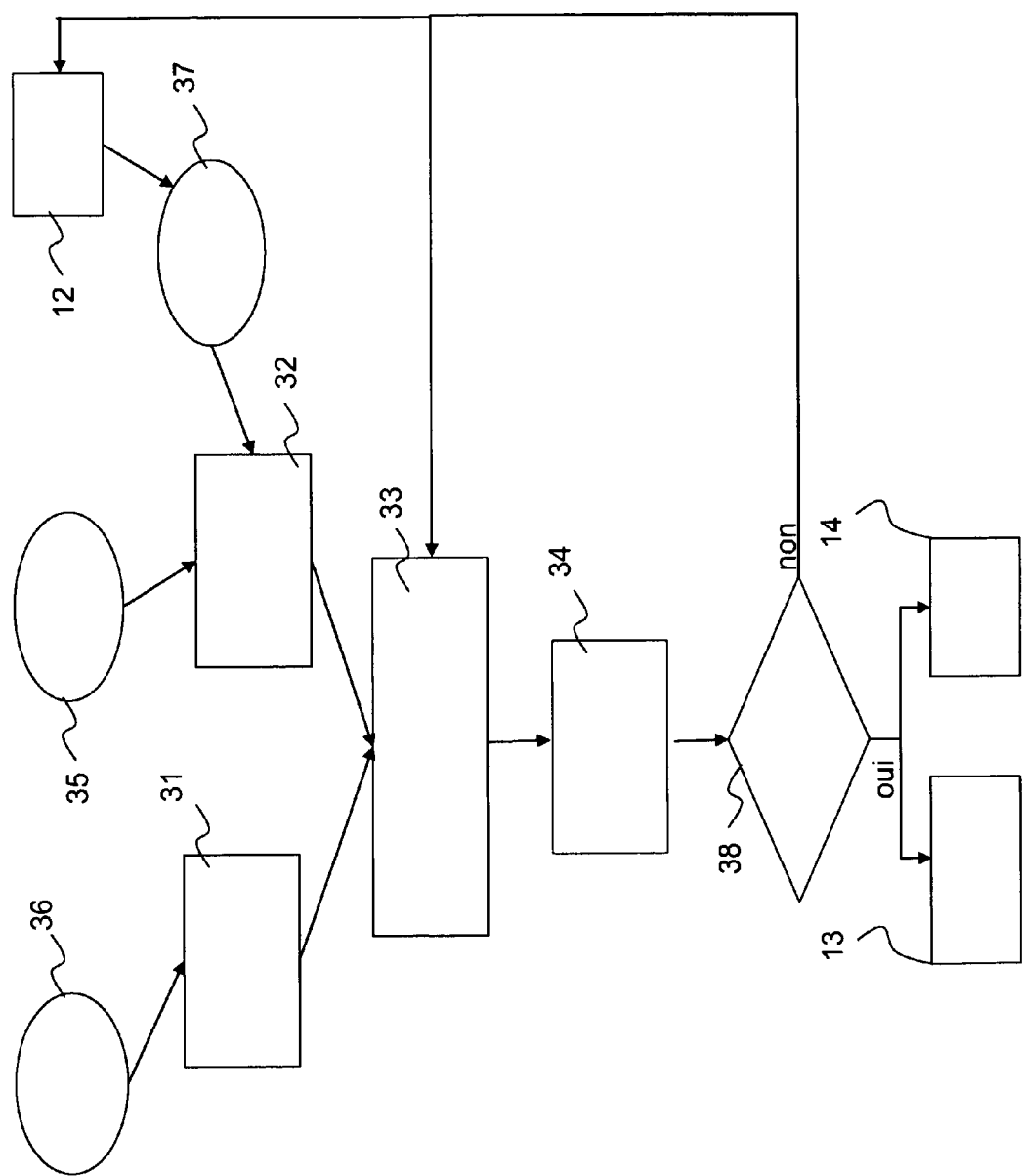
FIG. 3 represents the substeps constituting the upstream step for validating the non-functional requirements.

FIG. 3 represents the substeps that constitute the upstream step 21 for validating the non-functional requirements. In this upstream validation step 21, the functional requirements are allocated 33 to the architecture. The architectural rules 35 parameterized by the technologies employed 37 make it possible to compute the values of the non-functional parameters of the system. This then makes it possible to verify 38 that the computed functional parameters measure up to the expected values (i.e. the requirements). If there is a deviation, a rethinking either of the technologies employed or of the allocation of the functional need to the architecture makes it possible as early as this phase to modify the design of the system.

The upstream step for validating the non-functional requirements comprises the following steps:

- modelling 31 of the functional need based on said hierarchical breakdown 36,
- modelling 32 of the architecture 37 according to predefined architecture rules 35,
- allocation 33 of the model of the functional need to the model of the architecture, making it possible to obtain a functional model allocated to the architecture model,
- computation 34 of at least one non-functional parameter from the functional model allocated to the architecture model,
- comparison 38 of the computed non-functional parameter with the non-functional requirement,
- if the non-functional requirement is met, design of the hardware components 13 and software components 14,
- if the non-functional requirement is not met, definition 12 of a new architecture 37 or search for a new allocation 33 for the model of the functional need to the model of the architecture.

The functional model is a simplified representation of a functionality comprising just a few characteristics of the functionality such as the complexity, the input and output data (but not the detailed algorithms used to produce the outputs from the inputs). This functional model differs from the simulation functional models which describe the functionality itself very precisely. The simulation models explain the logical link between the input data of the functionality and its output data. Such is not the case with the inventive functional model.

The system architecture is designed according to an architectural style which is a self-imposed law defining the behaviour of the basic building blocks of the system and the way in which they cooperate. One of the key elements of the inventive method is the formalizing of the architectural style by laws governing the non-functional parameters of an architecture designed according to said style. Establishing these laws requires a prior knowledge of the duly modelled architecture or of a similar reference architecture. It is necessary to have at least one law for each non-functional parameter that is to be computed:

- performance,
- testability, that is, the facility to trace the failures and plot the requirements,
- integrity,
- availability.

These laws are collectively referred to as "architectural rules".

The basic building blocks of the system are associated with a law governing a non-functional parameter. The model of the architecture according to the invention differs from the simulation architectural models. The simulation models precisely specify the behaviour of a component. Such is not the case with the inventive functional model where only the laws governing non-functional parameters are taken into account.

The non-functional parameter is computed from the summary characteristics of the functional model and the laws governing the non-functional parameter associated with a component of the architecture. This computation differs from a simulation which uses runtime scenarios to generate an execution of a model of a software application on a hardware architecture. The inventive computation does not require any execution scenario.

Generally, a system is broken down into different levels which correspond to the level of detail applied to the description of the system components. The first level describes the organization of the system in subsystems. The second level describes the grouping of runtime platforms into subsystems. The third level describes how the runtime platforms are made up of IT platforms. The last level concerns the IT platforms consisting of cards and electronic modules. The inventive method can be applied to all the system design levels.

For example, at a runtime platform level, there are laws describing the computation load of a processor, the occupancy rate of a bus or the response time of a function.

Figure 4:
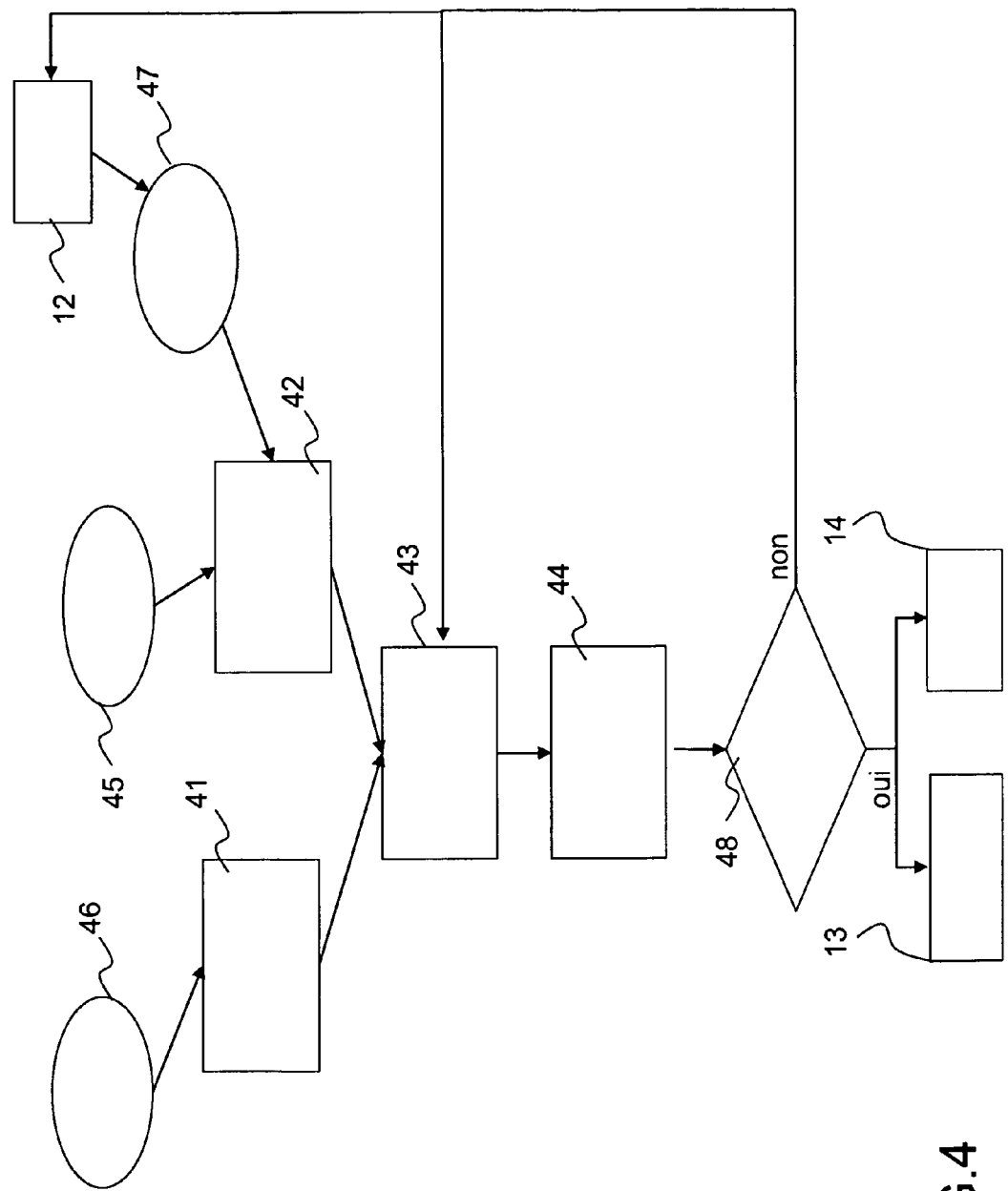
FIG. 4 corresponds to the substeps of FIG. 3 applied to a runtime platform.

In the example described below, given by way of non-limiting example, the inventive method is applied at the level of a runtime platform. The upstream step for validating the non-functional requirements illustrated by FIG. 4 then comprises the following steps.

The functional requirement is modelled 41 by identifying functional subsystems based on a functional breakdown 46. The functional breakdown is obtained in the functional analysis phase by progressively refining the functional behaviours and by identifying the individual processing operations contributing to the performance of the function. It is assumed that the functional analysis has made it possible to identify a functional breakdown comprising four individual functionalities $F_1$, $F_2$, $F_3$ and $F_4$. Modelling the functional need then consists in associating a processing operation with each of the individual functionalities, defining an order concerning the duly defined processing operations and linking the processing operations by interchanges. The set formed by the succession of processing operations and interchanges is called a functional subsystem.

Figure 5:
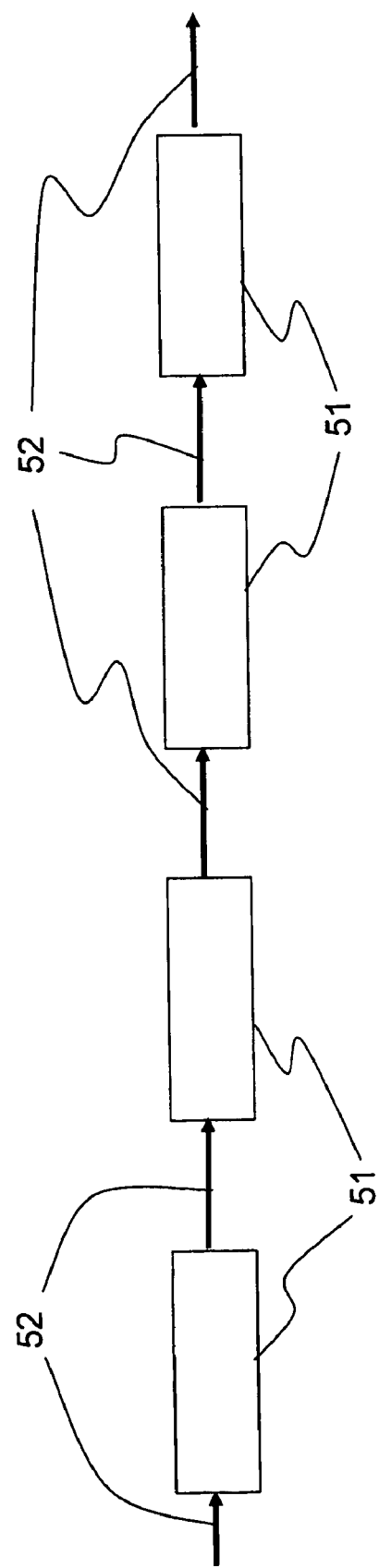
FIG. 5 represents an exemplary functional subsystem.

FIG. 5 illustrates the functional subsystem obtained on completion of the modelling phase. It comprises four processing operations $T_1$, $T_2$, $T_3$ and $T_4$ 51 and interchanges 52. A processing operation 51 comprises: a complexity, an activation law and modes. The complexity of a processing operation is defined in relation to a standard, for example a reference benchmark such as dhrystone or whetstone. In the aeronautical field, more specific benchmarks such as MIPS-AIR can be used.

A non-functional requirement such as a response time requirement is reflected by a functional subsystem transit time value. In this example, the aim is to satisfy the following requirement: the functional subsystem defined by the preceding processing operations and interchanges must be transited in 100 milliseconds.

The architecture 47 is modelled 42 with processors linked by buses, each of said processors being divided into time partitions. The time partitions are used to allocate application run times to the processors. It is possible, for example, to require a processor to run a first application for half of its time and a second application for the other half of its time. The time partitions are subdivided into computation tasks. The architecture is modelled with architectural rules. At this level, the architectural rules define the number and the size of the tasks in each of the partitions.

In our example, we are using an architecture 47 comprising a processor $Proc_1$ having a time partition $Par_1$, subdivided into six computation tasks: $A_1, A_2, A_3, A_4, A_5$ and $A_6$. These tasks are defined as follows:

The task $A_1$ is the maximum priority task and is activated cyclically at 50 Hz.
The tasks $A_2, A_3, A_4$ are harmonic in frequency and by the power of 2 to the task $A_1$ and of respective descending priority, 25 Hz, 12.5 Hz and 6.25 Hz.

The tasks $A_5$ and $A_6$ are tasks activated at the request of the software hosted by the architecture and have, for $A_5$, a priority between $A_1$ and $A_2$ and, for $A_6$, a priority less than $A_4$.

Two architectural rules 45 applying to the previously defined architecture are defined.

The first architectural rule requires the communications between the tasks to be such that the maximum latency of a communication between the two tasks is equal to the period of the periodic task of priority greater than or equal to the destination task, except for the sequencing of random tasks where this latency is counted only once.

The second architectural rule requires the computation times to be masked by the communication latencies if the tasks do not overrun a computation cycle.

The next step consists in allocating 43 the processing operations to the tasks to obtain a functional model allocated to the architectural model. There are many possible allocations. The choice of an allocation influences the non-functional parameters of the system.

A first allocation is described by the table below.

|  | | $PROC_1$ | | | | | |
|  | | $PAR_1$ | | | | | |
|  | complexity | $A_1$ | $A_2$ | $A_3$ | $A_4$ | $A_5$ | $A_6$ |
| --- | --- | --- | --- | --- | --- | --- | --- |
| $T_1$ | 2 | | | x | | | |
| $T_2$ | 1 | | x | | | | |
| $T_3$ | 3 | | | | x | | |
| $T_4$ | 1 | | | | | | x |

The first allocation consists in executing $T_1$ on $A_3$, $T_2$ on $A_2$, $T_3$ on $A_4$ and $T_4$ on $A_6$.

Computing 44 non-functional parameters based on the functional model allocated to the architectural model entails computing the overall latency of the processing subsystem. This first overall latency $L_1$ is equal to the sum of the computation times of the processing operations $T_1, T_2, T_3$ and $T_4$ and of the communication times between these processing operations.

The activation time of $T_1$ is equal to a period of $A_3$, the frequency of which is 12.5 Hz, or 80 ms.

The application of the second architectural rule tells us that the computation times are masked by the communication times. Therefore, the computation times of $T_2, T_3$ and $T_4$ are disregarded in computing the latency of the functional subsystem. The communication times are equal to the periods of the destination tasks, or respectively 40 ms (25 Hz period), 160 ms (6.25 Hz period) and 0 ms (in effect, the latency of the activation of the task $A_6$ is masked by the latency of the activation of the preceding cyclical task $A_4$ with a period of 160 ms) respectively for the communications T1-T2, T2-T3 and T3-T4. The following therefore applies:

$$L1 = 80\ ms + 40\ ms + 160\ ms + 0\ ms$$

A first overall latency $L_1$ is obtained that is equal to 280 ms. The comparison 48 of this value with the fixed requirement of 100 ms shows that the requisite functional requirement is not met. It is therefore necessary to repeat the architecture definition step 12 or the step 43 for allocating the processing operations to the tasks.

A second allocation is defined, represented in the following table:

|   | complexity | A₁ | A₂ | A₃ | A₄ | A₅ | A₆ |
|---|---|---|---|---|---|---|---|
| | | PROC₁ | | | | | |
| | | PAR₁ | | | | | |
| $T_1$ | 2 | | | x | | | |
| $T_2$ | 1 | | | x | | | |
| $T_3$ | 3 | X | | | | | |
| $T_4$ | 1 | | | | | X | |

The second allocation involves executing $T_1$ and $T_2$ on $A_2$, $T_3$ on $A_1$ and $T_4$ on $A_5$.

By carrying out a computation similar to the preceding one, a second overall latency $L_2$ is obtained for the functional subsystem that is equal to 100 ms. This value conforms to the set requirement.

This computation therefore makes it possible to verify that the chosen architecture makes it possible to run the application and meet the response time requirement on the processing subsystem.

It will be readily seen by one of ordinary skill in the art that the present invention fulfils all of the objects set forth above. After reading the foregoing specification, one of ordinary skill in the art will be able to affect various changes, substitutions of equivalents and various aspects of the invention as broadly disclosed herein. It is therefore intended that the protection granted hereon be limited only by definition contained in the appended claims and equivalents thereof.

The invention claimed is:

1. A method of designing a system, the system including an application having software components and an architecture having hardware components on which the application is run, the system has platforms including cards and electronic modules, the system has to satisfy at least one functional requirement and at least one non-functional requirement, the method comprising the following steps:
   a functional analysis step, for obtaining a breakdown of the functional requirement relating to said application,
   a step for defining the architecture,
   a step for designing hardware components according to said architecture,
   a step for designing software components based on the breakdown of the functional requirement,
   a step for integrating the software components in the hardware components,
   a step for validating the functional requirement of said system,
   a step for validating the non-functional requirement of said system,
   wherein it also comprises an upstream step for validating the non-functional requirement of said system, preceding the steps for designing hardware components and software components, said upstream step for validating the non-functional requirement comprising the following steps:
   modelling of the functional requirement based on said hierarchical breakdown,
   modelling of the architecture according to predefined architecture rules, said modelling of the architecture being performed with processors linked by buses,
   allocation of the model of the functional requirement to the model of the architecture, making it possible to obtain a functional model allocated to the architecture model,
   computation of at least one non-functional parameter from the functional model allocated to the architecture model,
   comparison of the computed non-functional parameter with the non-functional requirement,
   if the non-functional requirement is met, designing the hardware components and software components,
   if the non-functional requirement is not met, defining a new architecture or search for a new allocation of the model of the functional requirement to the model of the architecture.

2. The method according to claim 1, wherein the computed non-functional parameter relates to the performance of the system and comprises at least one of the following elements: the computation load of a processor, the bandwidth consumption of a network, the memory volume consumed by a processor, the system transit time.

3. The method according to claim 1, wherein the computed non-functional parameter relates to the safety of the system and comprises in particular the application of sets of inputs provoking particular events.

4. The method according to claim 1, wherein the computed non-functional parameter relates to the integrity of the system.

5. The method according to claim 1, wherein the computed non-functional parameter relates to the availability of the system and comprises in particular the availability rate of the architecture.

6. The method according to claim 1, wherein said system is a runtime platform and said upstream step for validating the non-functional requirement comprises the following steps:
   modelling of the functional requirement with functional subsystems, said functional subsystems alternately comprising processing operations and interchanges,
   modelling of the architecture with a group of computation nodes linked by buses, each of said computation nodes comprising partitions, said partitions being subdivided into tasks,
   allocation of said processing operations to said tasks, making it possible to obtain a functional model allocated to the architecture model,
   computation of non-functional parameters from the functional model allocated to the architecture model,
   comparison of the computed non-functional parameter with the non-functional requirement,
   if the non-functional requirement is met, designing the hardware and software components,
   if the non-functional requirement is not met, defining a new architecture or search for a new allocation of the processing operations to the tasks.

* * * * *